(12) United States Patent
Roohparvar

(10) Patent No.: US 7,782,677 B2
(45) Date of Patent: Aug. 24, 2010

(54) NAND MEMORY DEVICE COLUMN CHARGING

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 12/246,289

(22) Filed: Oct. 6, 2008

(65) Prior Publication Data

US 2009/0034331 A1 Feb. 5, 2009

Related U.S. Application Data

(63) Continuation of application No. 11/276,480, filed on Mar. 1, 2006, now Pat. No. 7,436,708.

(51) Int. Cl.
*G11C 11/34* (2006.01)

(52) U.S. Cl. ............................. 365/185.18; 365/185.24

(58) Field of Classification Search ............ 365/185.18, 365/185.24
See application file for complete search history.

(56) References Cited

U.S. PATENT DOCUMENTS

| | | |
|---|---|---|
| 5,041,886 A | 8/1991 | Lee |
| 5,243,700 A | 9/1993 | Larsen et al. |
| 5,453,957 A | 9/1995 | Norris et al. |
| 5,522,086 A | 5/1996 | Burton et al. |
| 5,537,354 A | 7/1996 | Mochizuki et al. |
| 5,600,605 A | 2/1997 | Schaefer |
| 5,642,480 A | 6/1997 | Brownlee et al. |
| 5,666,321 A | 9/1997 | Schaefer |
| 5,680,347 A * | 10/1997 | Takeuchi et al. ....... 365/185.17 |
| 5,751,039 A | 5/1998 | Kauffman et al. |
| 5,768,199 A | 6/1998 | Inoue |
| 5,787,457 A | 7/1998 | Miller et al. |
| 5,835,414 A * | 11/1998 | Hung et al. ............ 365/185.25 |
| 5,892,777 A | 4/1999 | Nesheiwat et al. |
| 5,936,903 A | 8/1999 | Jeng et al. |
| 5,953,255 A | 9/1999 | Lee |
| 5,986,943 A | 11/1999 | Isa |
| 5,995,438 A | 11/1999 | Jeng et al. |
| 6,026,465 A | 2/2000 | Mills et al. |
| 6,046,940 A * | 4/2000 | Takeuchi et al. ....... 365/185.17 |
| 6,058,044 A * | 5/2000 | Sugiura et al. ......... 365/185.17 |
| 6,064,627 A | 5/2000 | Sakurai |
| 6,073,204 A | 6/2000 | Lakhani et al. |
| 6,119,210 A | 9/2000 | Leon et al. |
| 6,137,133 A | 10/2000 | Kauffman et al. |
| 6,141,247 A | 10/2000 | Roohparvar et al. |

(Continued)

FOREIGN PATENT DOCUMENTS

EP          929075 A1     7/1999

(Continued)

*Primary Examiner*—Michael T Tran
(74) *Attorney, Agent, or Firm*—Schwegman, Lundberg & Woessner, P.A.

(57) ABSTRACT

Embodiments of NAND Flash memory devices and methods recognize that effective column coupling capacitance can be reduced by maintaining a sourced voltage on adjacent columns of an array. Maintaining the columns in a charged state prior to array operations (read, write, and program) reduces current surges and improves data read timing. Devices and methods charge the array columns at pre-charge and following array access operations.

21 Claims, 3 Drawing Sheets

U.S. PATENT DOCUMENTS

| | | | |
|---|---|---|---|
| 6,191,994 | B1 | 2/2001 | Ooishi |
| 6,240,020 | B1 | 5/2001 | Yang et al. |
| 6,279,069 | B1 | 8/2001 | Robinson et al. |
| 6,295,640 | B1 | 9/2001 | Eidt |
| 6,327,663 | B2 | 12/2001 | Isaac et al. |
| 6,378,018 | B1 | 4/2002 | Tsern et al. |
| 6,401,163 | B1 | 6/2002 | Kondo et al. |
| 6,480,419 | B2 * | 11/2002 | Lee ................ 365/185.18 |
| 6,510,081 | B2 | 1/2003 | Blyth et al. |
| 6,574,128 | B1 * | 6/2003 | Morgan ................ 365/72 |
| 6,980,471 | B1 | 12/2005 | Samachisa |
| 7,054,992 | B2 | 5/2006 | Roohparvar |
| 7,196,933 | B2 | 3/2007 | Shibata |
| 7,436,708 | B2 | 10/2008 | Roohparvar |
| 2001/0038547 | A1 | 11/2001 | Jigour et al. |
| 2002/0056063 | A1 | 5/2002 | Nerl |
| 2003/0051093 | A1 | 3/2003 | Takeuchi |
| 2005/0050235 | A1 | 3/2005 | Choi |
| 2005/0226046 | A1 | 10/2005 | Lee et al. |
| 2006/0146612 | A1 | 7/2006 | Lim et al. |
| 2006/0161724 | A1 | 7/2006 | Bennett et al. |
| 2006/0161728 | A1 | 7/2006 | Bennett et al. |
| 2007/0206422 | A1 | 9/2007 | Roohparvar |

FOREIGN PATENT DOCUMENTS

| | | |
|---|---|---|
| WO | WO-0175890 A2 | 10/2002 |
| WO | WO-0142929 A1 | 6/2007 |
| WO | WO-2007103045 A2 | 9/2007 |
| WO | WO-2007103045 A3 | 9/2007 |

* cited by examiner

NAND MEMORY DEVICE COLUMN CHARGING

RELATED APPLICATION

This application is a continuation of U.S. application Ser. No. 11/276,480, filed Mar. 1, 2006, now issued as U.S. Pat. No. 7,436,708, which is incorporated herein its entirety.

FIELD OF THE INVENTION

The present invention relates to non-volatile memory devices and, more particularly, to NAND flash memory devices.

BACKGROUND

Flash memory is non-volatile, which means that it stores information on a semiconductor in a way that does not need power to maintain the information in the chip. Flash memory stores information in an array of transistors, called "cells," each of which stores one or more bits of information. The memory cells are based on the Floating-Gate Avalanche-Injection Metal Oxide Semiconductor (FAMOS transistor) which is essentially a Complimentary Metal Oxide Semiconductor (CMOS) Field Effect Transistor (FET) with an additional conductor suspended between the gate and source/drain terminals. Current flash memory devices are made in two basic array architectures: NOR flash and NAND flash. The names refer to the type of logic used in the storage cell array.

A flash cell is similar to a standard MOSFET transistor, except that it has two gates instead of just one. One gate is the control gate (CG) like in other MOS transistors, but the second is a floating gate (FG) that is insulated all around by an oxide layer. Because the FG is isolated by its insulating oxide layer, any electrons placed on it get trapped there and thus store the information.

When electrons are trapped on the FG, they modify (partially cancel out) an electric field coming from the CG, which modifies the threshold voltage (Vt) of the cell. Thus, when the cell is "read" by placing a specific voltage on the CG, electrical current will either flow or not flow between the cell's source and drain connections, depending on the Vt of the cell. This presence or absence of current can be sensed and translated into 1's and 0's, reproducing the stored data.

Memory cells of memory devices are typically arranged in an array with rows and columns. Generally, the rows are coupled via a word line conductor and the columns are coupled via a bit line conductor. During data read functions the bit line conductors are pre-charged to a selected voltage level. As the population of NAND memory devices increases, issues with memory cell to memory cell coupling, column to column coupling, current consumption, operating performance and data accuracy are all experienced.

For reasons stated below which will become apparent to those skilled in the art upon reading and understanding the present specification, there is a need for improving performance of NAND memory read operations.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dice, as is well known in the art. The figures are provided to help facilitate an understanding of the detailed description, are not intended to be accurate in scale, and have been simplified. The term conductor as used herein is intended to include conductors and semi-conductors, including but not limited to metals, metal alloy, doped silicon and polysilicon. The following detailed description is, therefore, not to be taken in a limiting sense, and the scope of the present invention is defined only by the appended claims, along with the full scope of equivalents to which such claims are entitled.

Figure 1:
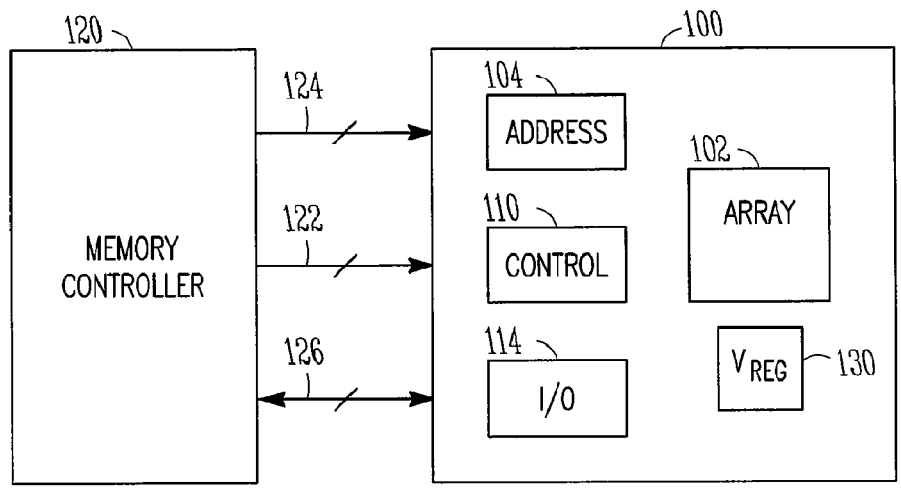
FIG. 1 is a block diagram of a memory device according to embodiments of the present invention.

FIG. 1 is a simplified block diagram of an integrated circuit memory device 100 in accordance with an embodiment of the invention. The memory device 100 includes an array of non-volatile floating gate memory cells 102, address circuitry 104, control circuitry 110, and Input/Output (I/O) circuitry 114. The memory cells are also referred to as Flash memory cells because blocks of memory cells are typically erased concurrently, in a 'flash' operation.

The memory device 100 can be coupled to a processor 120 or other memory controller for accessing the memory array 102. The memory device 100 coupled to a processor 120 forms part of an electronic system. Some examples of electronic systems include personal computers, peripheral devices, wireless devices, digital cameras, personal digital assistants (PDA's) and audio recorders.

The memory device 100 receives control signals across control lines 122 from the processor 120 to control access to the memory array 102 via control circuitry 110. Access to the memory array 102 is directed to one or more target memory cells in response to address signals received across address lines 124. Once the array is accessed in response to the control signals and the address signals, data can be written to or read from the memory cells across data, DQ, lines 126.

The control circuitry 110 is illustrated generally as a block of circuitry that includes circuitry to perform numerous memory array and peripheral operations. It will be appreciated that the control circuitry for the memory device is not a discreet circuit, but comprises circuits that are distributed throughout the memory. The control circuitry in one embodiment includes circuitry to perform read, erase and write operations on the memory array.

A voltage regulator 130 provides one or more regulated voltages for use in the memory device. The voltage regulator can provide positive or negative voltages. In one embodiment the regulator provides a predetermined voltage to charge conductors of the array, such as column bit lines as explained below.

It will be appreciated by those skilled in the art that additional circuitry and control signals can be provided, and that the memory device of FIG. 1 has been simplified to help focus on the invention. It will be understood that the above description of a memory device is intended to provide a general understanding of the memory and is not a complete description of all the elements and features of a typical memory device.

Figure 2:
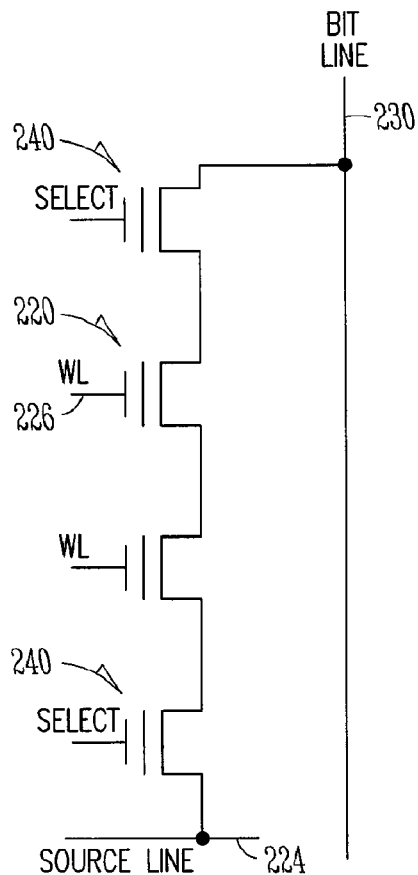
FIG. 2 illustrates a simplified portion of a prior art NAND flash memory array.

FIG. 2 illustrates a simplified portion of a prior art NAND flash memory array. NAND Flash uses tunnel injection for writing and tunnel release for erasing. The NAND memory includes floating gate memory cells 220 coupled to a source line 224, word lines 226 and a bit line 230. The cells are coupled in series between the bit line and source line. One or more bit line select transistors 240 are used to selectively isolate the cells from the bit and source lines.

In a read operation, a word line of a target (selected) memory cell can be maintained at a low voltage level. All unselected cell word lines are coupled to a voltage sufficiently high to activate the unselected cells regardless of their floating gate charge. If the selected cell has an uncharged floating gate, it is activated. The bit line and source line are then coupled through the series of memory cells. If the selected cell has a charged floating gate, it will not activate. The bit line and source lines, therefore, are not coupled through the series of memory cells.

Because of the close proximity of the memory cells, bit line coupling can be a problem during reading/sensing operations. That is, the length and close spacing of adjacent bit lines results in voltage noise on bit lines. Of particular concern is bit line coupling during write verify operations. As known to those skilled in the art, a write operation typically includes one or more program steps and one or more read/verify steps.

To address the bit line coupling issue, prior art NAND flash memories divide word lines (rows) into two logical pages. The pages are interwoven such that alternating bit lines of an array belong to different pages. During operation, one page can be active and the other page can be inactive. The bit lines of the inactive page are coupled to a high potential, such as Vcc, during a program operation. The Vcc biased bit lines, therefore, prevent memory cells coupled to a common word line from being programmed.

In prior art NAND memory devices the column or bit lines of the inactive page are discharged to a ground potential and the columns of the active page are pre-charged to a high potential, such as Vcc, prior to reading a memory page. The grounded columns provide some protection from column cross-talk. A single level prior art NAND memory can be read in about 25 micro-seconds, while a multi-level NAND memory can take in excess of 50 micro-seconds to read.

Several issues have been experienced with the above NAND memory design as a result of the increased population of current memory devices combined with the operational specifications for NAND memories. The pre-charge operation can result in a current surge. For example, a NAND memory with 32,000 columns can have 50 to 75 nano-Farads (nF) of capacitance for one-half of the array columns (3-5 pico-Farads per column). To charge 75 nF to one volt in 1 micro-second requires an average of 75 milli-amps. Because of peak current restrictions, prior art NAND memory devices stager the column pre-charge operation. As a result, the total read/verify operation can be significantly slower than desired.

In addition to slower performance, multi-level NAND cells are sensitive to internal voltage regulator surges caused by the pre-charge operation.

The coupling capacitance between columns of prior NAND memory devices is large. Embodiments of the present invention recognize that the effective column coupling capacitance can be reduced by maintaining a sourced voltage on adjacent columns. Further, maintaining the columns in a charged state prior to array operations (read, write, and program) reduces current surges and improves data read timing.

In operation, the NAND memory columns are charged to a positive voltage, such as Vcc, upon power-up of the device. As such, the columns are charged prior to the first array operation. After the array operation is performed, the columns are re-charged in anticipation for subsequent array operations.

Figure 3:
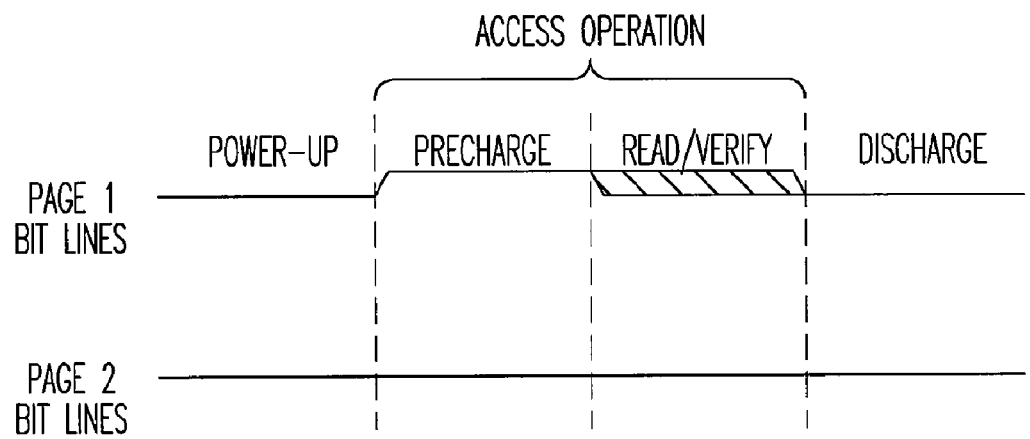
FIG. 3 is a simplified timing diagram of prior art NAND memory operations.
Figure 4:
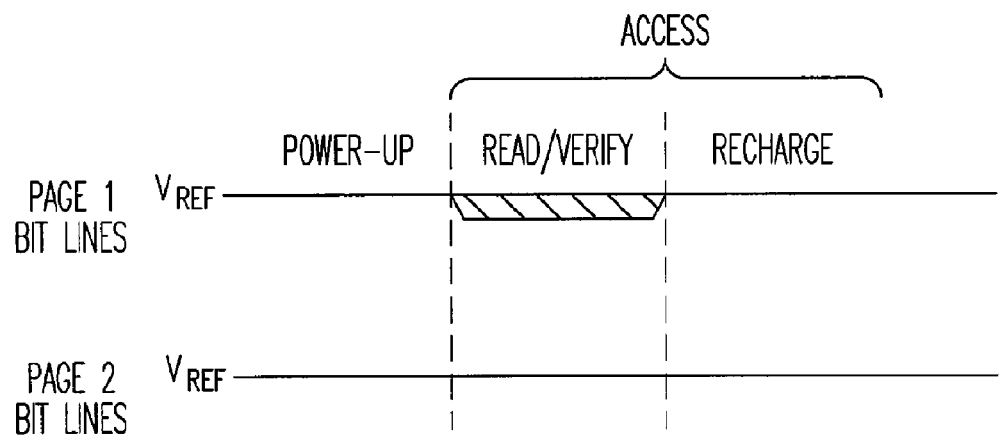
FIG. 4 is a simplified timing diagram of a NAND memory according to embodiments of the present invention.

Referring to FIGS. 3 and 4, prior art NAND memory functions and an embodiment of the present invention are compared. In FIG. 3, the prior art NAND memory device includes bit lines arranged in accessible Pages 1 and 2. The memory is powered-up and the page bit lines are coupled to a ground potential (uncharged). During an access operation of the array to Page 1, the column bit lines of Page 1 are selectively pre-charged. Page 2 bit lines remain uncharged. That is, while executing a read, or verify operation on Page 1, the column bit lines corresponding to a selected memory page are first pre-charged, while adjacent column bit lines corresponding to an unselected memory page remain uncharged. After pre-charging the bit lines, the Page 1 is accessed using a word line (row) and the bit line voltages are sensed, as described above. Following the sensing operation, the bit lines of Page 1 are discharged to remove any residual charge.

In FIG. 4, a NAND memory device of an embodiment also includes two Pages, Page 1 and Page 2. During operation, the memory is powered-up and all of the column bit lines of Pages 1 and 2 are coupled to a predetermined positive voltage (Vref) to pre-charge the bit lines. The voltage level is dependant upon memory device specification and fabrication, as such the present invention is not limited to a specific voltage or voltage range. Because the bit lines are charged at power-up, executing a read, or verify operation on Page 1 during an access operation proceeds to accessed memory cells using a word line (row) and sensing the bit line voltage. The bit lines of Page 2 remain charged during the access of Page 1. Following the sensing operation on Page 1, the bit lines are re-charged to place the columns into the charged state.

Figure 5:
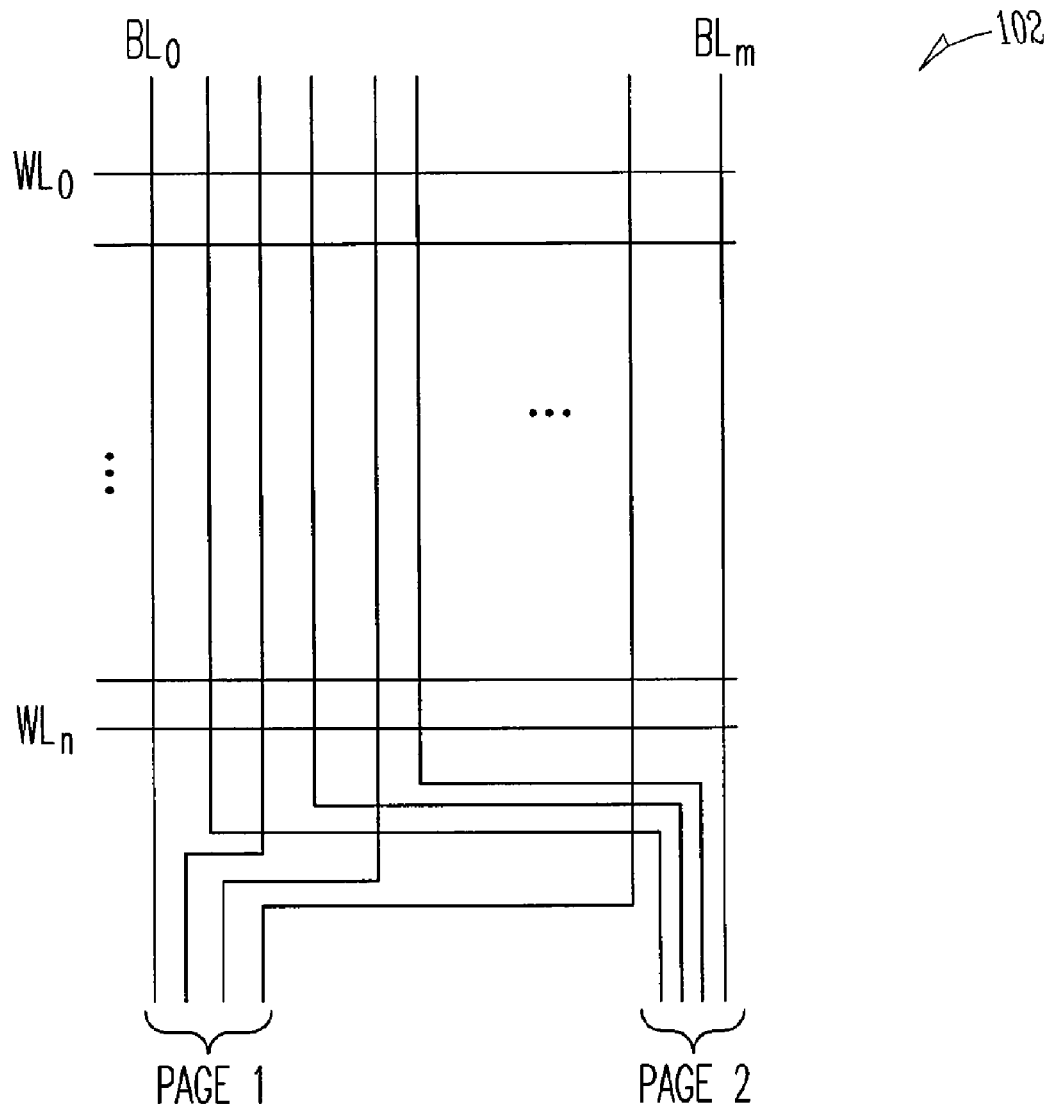
FIG. 5 illustrates array bit lines of the memory of FIG. 1.

Referring to FIG. 5, a simplified array of FIG. 1 is described. In one embodiment, a NAND flash memory includes an array of memory cells arranged in accessible rows and columns, wherein each column of memory cells are coupled to a bit line (BL0-$BL_M$). A voltage regulator circuit 130 (FIG. 1) provides a predetermined voltage and control circuitry 110 performs a read operation on a column, such as BL2 of the array of memory cells. The array is illustrated as having alternate columns assigned to different accessible pages when accessed using a word line WL0-$WL_N$. The even bit lines are assigned in the illustrated array to Page 1 and the odd bit lines to Page 2.

The read operation comprises sensing a voltage level of the bit line associated with the column being read, and charging the bit line to the predetermined voltage provided by voltage regulator circuit 130 following sensing the voltage level of the bit line. The control circuitry and voltage regulator circuit can charge the bit line to the predetermined voltage during a power-up operation of the memory device. In another embodiment, the control circuitry maintains a charge on first and second adjacent bit lines BL1 and BL3 located adjacent to and on opposite lateral sides of the bit line BL2 associated with the column being read while sensing the voltage level of BL2. Each memory cell of the array can store one data bit, or multiple bits of data using multiple voltage levels of the memory cell.

In another embodiment, a method of operating a NAND flash memory device includes powering up the memory device in response to an externally supplied power. All column bit lines BL0-BL$_M$ of the first and second data pages of an array of the memory are charged to a predetermined positive voltage level following powering up. A read operation is performed on the first data page while all column bit lines of the second data page are charged to the predetermined positive voltage level. The read operation includes accessing a row of memory cells by activating a word line conductor of the first data page such as WL0, and sensing a voltage potential of column bit lines of the first data page after accessing the row. All column bit lines of the first data page are re-charged to the predetermined positive voltage level following sensing the voltage potential of the column bit lines of the first data page.

In an example method of operating a NAND flash memory device, the method includes powering up the memory device in response to an externally supplied power;

charging all column bit lines of first and second data pages of an array of the memory to a predetermined positive voltage level following powering up; and performing a read operation on the first data page while all column bit lines of the second data page are charged to the predetermined positive voltage level.

In another example, the method including any above example, the read operation includes:

accessing a row of memory cells by activating a word line conductor of the first data page; and sensing a voltage potential of column bit lines of the first data page after accessing the row.

In another example, the method including any above example, each memory cell of the array stores multiple bits of data using multiple voltage levels of the memory cell.

In another example, the method including any above example, wherein the predetermined positive voltage level is about one volt.

In an example, a method of operating a NAND flash memory device includes charging all column bit lines of first and second data pages of an array of the memory to a predetermined positive voltage level prior to performing an array access operation; and performing a read operation on the first data page while all column bit lines of the second data page are charged to the predetermined positive voltage level.

In another example, the read operation includes:

accessing a row of memory cells by activating a word line conductor of the first data page; and sensing a voltage potential of column bit lines of the first data page after accessing the row.

In an example, the method includes charging all column bit lines of the first data page to the predetermined positive voltage level following sensing the voltage potential of the column bit lines of the first data page.

In an example, each memory cell of the array stores multiple bits of data using multiple voltage levels of the memory cell.

The invention claimed is:

1. A flash memory device comprising:

an array of memory cells having a column format arrangement, wherein each column of cells is coupled to a bit line, the bit lines arranged to form a first page and a second page; and circuitry to apply a voltage to the columns to reduce a column coupling capacitance and maintain the voltage on the columns of the first page as an inactive page while the second page as an active page is accessed.

2. The flash memory device of claim 1, wherein the circuitry is to apply a single voltage to the columns.

3. The flash memory device of claim 1, wherein the circuitry is to maintain a positive voltage level on all the bit lines prior to read, write, and program operations.

4. The flash memory device of claim 1, wherein the bit lines are arranged in an alternating pattern such that every other bit line is coupled together to form one of the first page or the second page.

5. The flash memory device of claim 1, wherein the bit lines associated with the first page and the bit lines associated with the second page are to receive from the circuitry substantially identical voltages.

6. A method of improving data read timing comprising:

pre-charging all bit lines of a first page and a second page of a flash memory to a specified positive voltage level, the bit lines formed in a staggered arrangement; and performing a logical operation on an active page while all column bit lines of an inactive page are maintained at the positive voltage level.

7. The method of claim 6, wherein performing includes performing a memory access operation.

8. The method of claim 7, wherein pre-charging includes re-charging all bit lines after performing a logical operation.

9. The method of claim 7, wherein pre-charging includes re-charging all bit lines before performing a next logical operation.

10. The method of claim 7, wherein pre-charging includes pre-charging to reduce a current surge during the logical operation.

11. A flash device comprising:

a plurality memory cells arranged in columns along bit lines, the bit lines coupled to form logical pages; and a charging device to provide a positive voltage level to the bit lines prior to initiating a memory access operation to reduce a transient current output from the charging device, wherein the logical pages include an active page and an inactive page, and wherein positive voltage to the bit lines associated with the inactive page is maintained during a memory access to the active page.

12. The flash device of claim 11, wherein the charging device is to further provide the positive voltage level to improve data read timing.

13. The flash device of claim 11, wherein the positive voltage to the bit lines is to reduce an effective column coupling capacitance.

14. The flash device of claim 11, wherein the logical pages are interwoven using an alternating bit line arrangement.

15. The flash device of claim 11, wherein the charging device is coupled to a memory controller.

16. The flash device of claim 11, wherein the charging device is to provide the positive voltage level when the memory cells receive power.

17. The flash device of claim 11, wherein the bit lines receive the positive voltage level at power-up, read execution and verify operations.

18. The flash device of claim 11, wherein the bit lines are coupled to receive logical information provided to one or more word lines during the memory access operation.

19. The flash device of claim 11, wherein the circuitry is to charge the bit lines to about one volt.

20. The flash device of claim 11, wherein at least one of the cells of the array of memory cells is to store multiple data bits.

21. The flash device of claim 11, wherein cells in the array are to store multiple voltage levels.

* * * * *